US011181596B2

(12) United States Patent
Zeller

(10) Patent No.: US 11,181,596 B2
(45) Date of Patent: Nov. 23, 2021

(54) METHOD FOR OBTAINING AN OPERATING PARAMETER, STORAGE MEDIUM, AND MAGNETIC RESONANCE APPARATUS

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/738,185

(22) Filed: Jan. 9, 2020

(65) Prior Publication Data
US 2020/0225305 A1 Jul. 16, 2020

(30) Foreign Application Priority Data

Jan. 11, 2019 (EP) ..................................... 19151327

(51) Int. Cl.
*G01V 3/00* (2006.01)
*G01R 33/54* (2006.01)
*G01R 33/56* (2006.01)
*G01R 33/565* (2006.01)

(52) U.S. Cl.
CPC ....... *G01R 33/543* (2013.01); *G01R 33/5608* (2013.01); *G01R 33/56554* (2013.01)

(58) Field of Classification Search
CPC .............. G01R 33/543; G01R 33/5659; G01R 33/3415; G01R 33/36; A61B 5/055
USPC ......................................................... 324/309
See application file for complete search history.

(56) References Cited

U.S. PATENT DOCUMENTS

| 5,570,020 A * | 10/1996 | Bornert | G01R 33/56554 324/309 |
| 5,729,139 A * | 3/1998 | Goto | G01R 33/56518 324/309 |
| 6,188,219 B1 * | 2/2001 | Reeder | G01R 33/58 324/307 |
| 2002/0002331 A1 * | 1/2002 | Cline | G01R 33/54 600/410 |

(Continued)

OTHER PUBLICATIONS

European Search Report for European Patent Application No. 19151327.4-1022 dated Jul. 24, 2019.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A storage medium, a magnetic resonance apparatus, and a method for obtaining an operating parameter of a magnetic resonance apparatus are disclosed herein. The method includes generating of at least one echo train, wherein the generation of an echo train includes: setting a given set of parameters; applying at least one radio frequency excitation pulse; and applying a dephasing gradient in readout direction; and reading out the echo train having at least two echo signals, wherein a readout gradient is applied while reading out the echo signals. The method further includes acquiring at least two echo signals, wherein the set of parameters differs in at least one parameter being used for different echo signals; processing the echo signals line by line to projections; and obtaining the operating parameter using the projections.

13 Claims, 8 Drawing Sheets

(56) References Cited

U.S. PATENT DOCUMENTS

| | | |
|---|---|---|
| 2003/0109781 A1 | 6/2003 | Zhang |
| 2004/0027126 A1* | 2/2004 | Shah ................ G01R 33/50 |
| | | 324/309 |
| 2006/0106300 A1* | 5/2006 | Seppenwoolde .... G01R 33/286 |
| | | 600/410 |
| 2006/0111528 A1* | 5/2006 | Coates .................. C08F 10/00 |
| | | 526/172 |
| 2006/0176055 A1 | 8/2006 | Fukuta |
| 2011/0234221 A1* | 9/2011 | Feiweier .......... G01R 33/56518 |
| | | 324/307 |
| 2015/0160322 A1* | 6/2015 | Matthews ........ G01R 33/56341 |
| | | 324/322 |
| 2017/0038450 A1* | 2/2017 | Hoge .................. G01R 33/561 |
| 2019/0178965 A1 | 6/2019 | Paul |

OTHER PUBLICATIONS

Porter, David A., and Robin M. Heidemann. "High resolution diffusion-weighted imaging using readout-segmented echo-planar imaging, parallel imaging and a two-dimensional navigator-based reacquisition." Magnetic Resonance in Medicine: An Official Journal of the International Society for Magnetic Resonance in Medicine 62.2 (2009): 468-475.

* cited by examiner

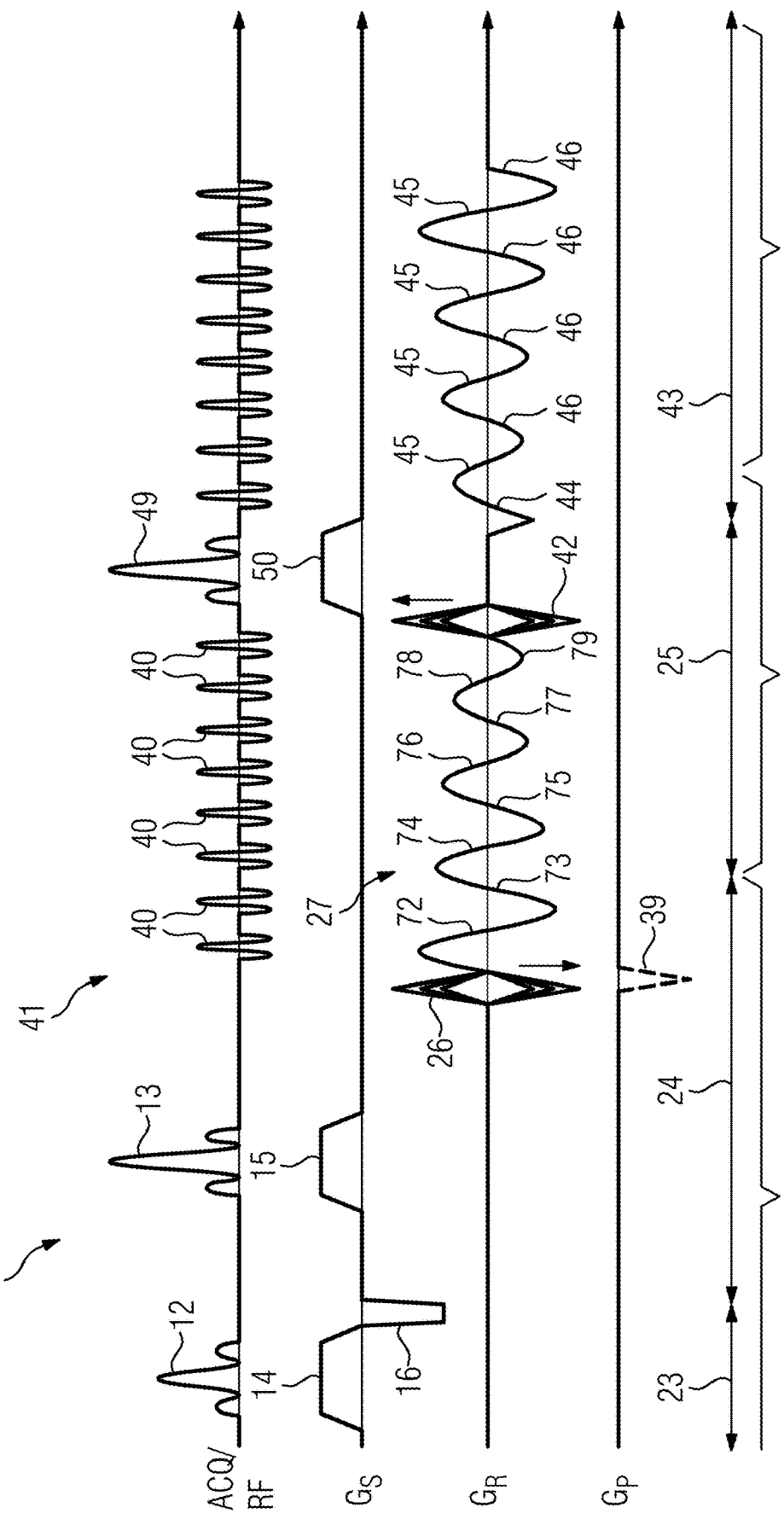

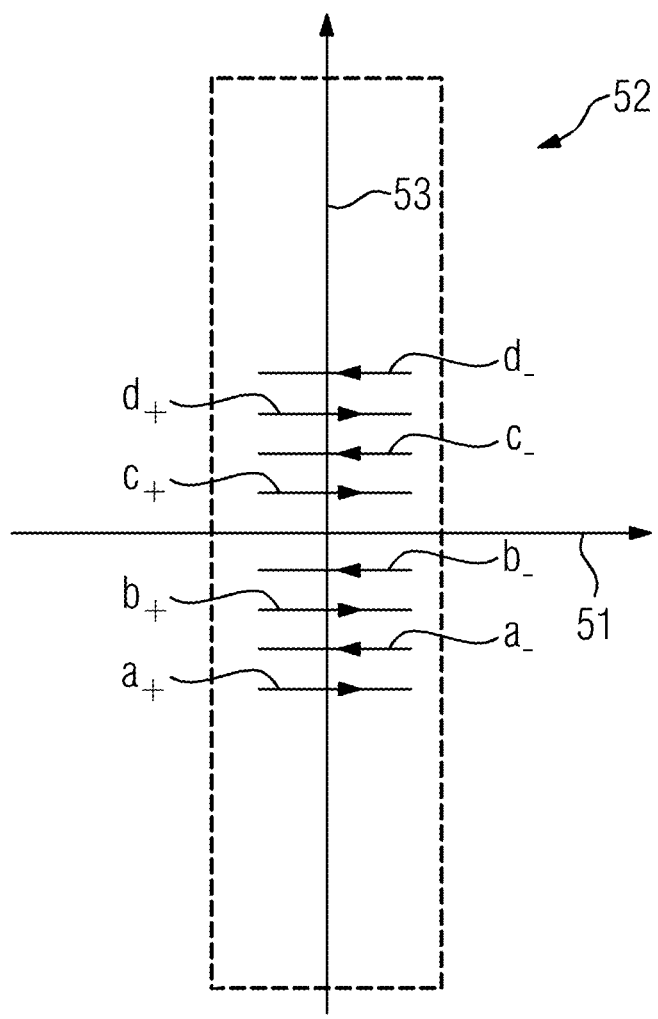

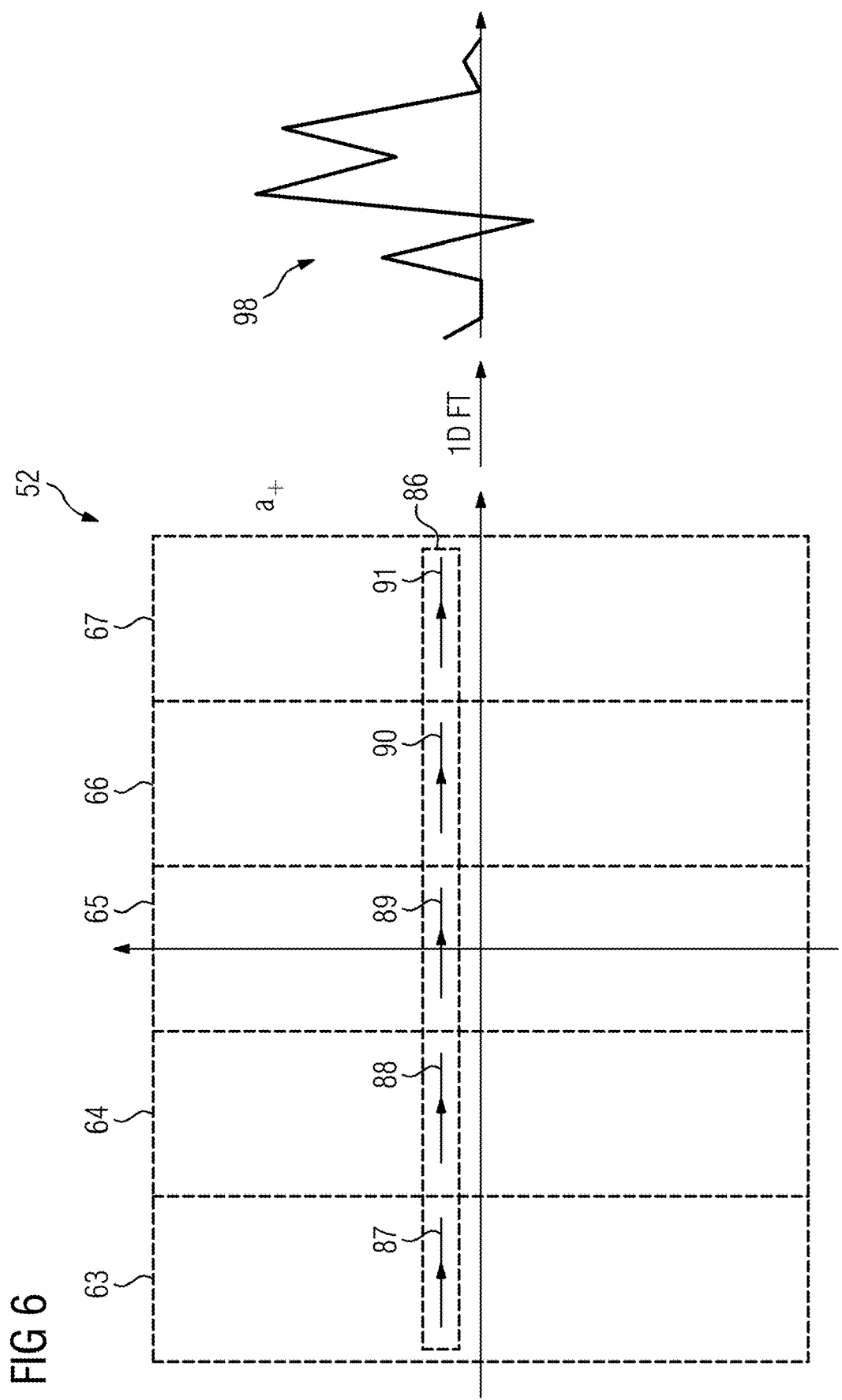

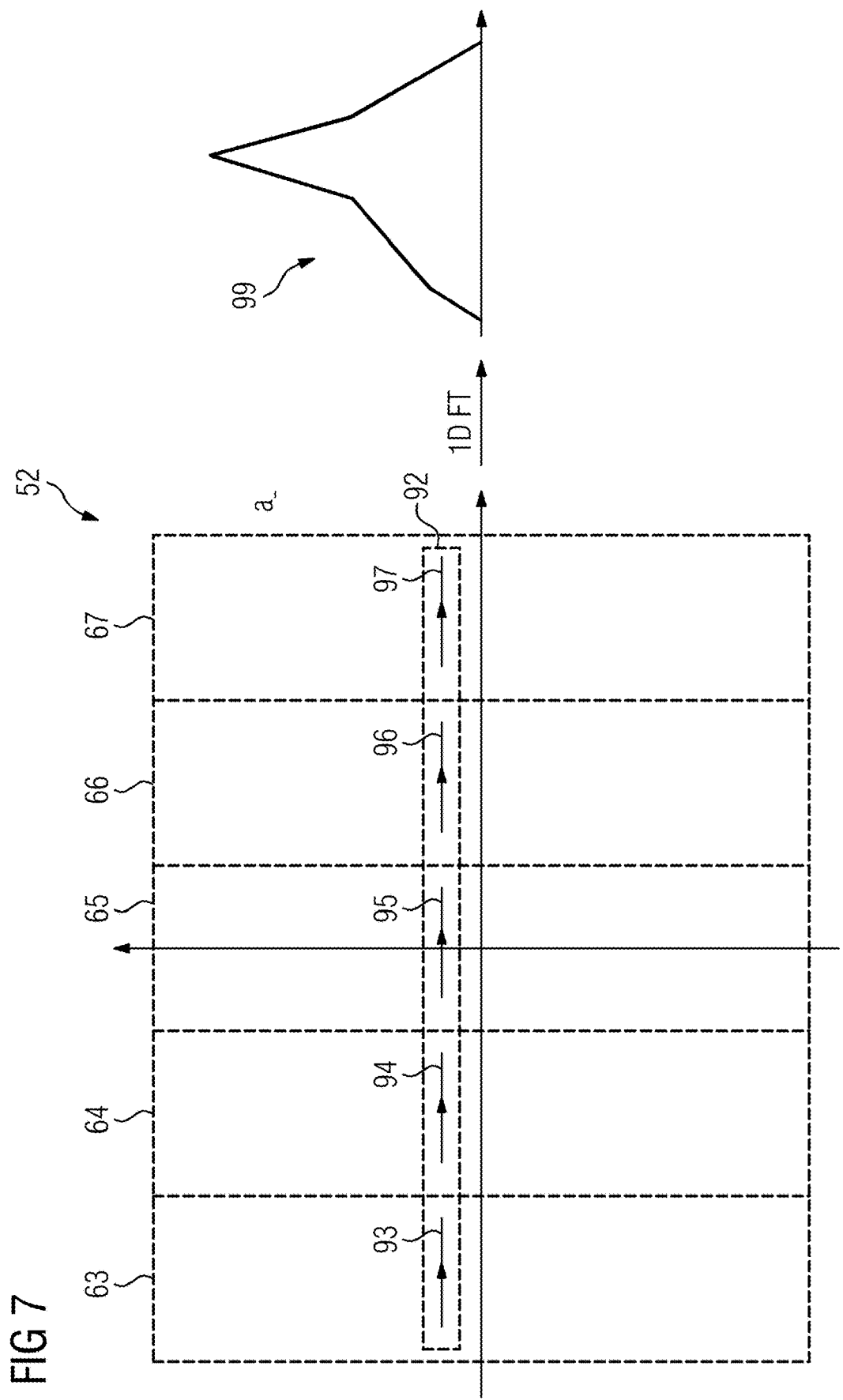

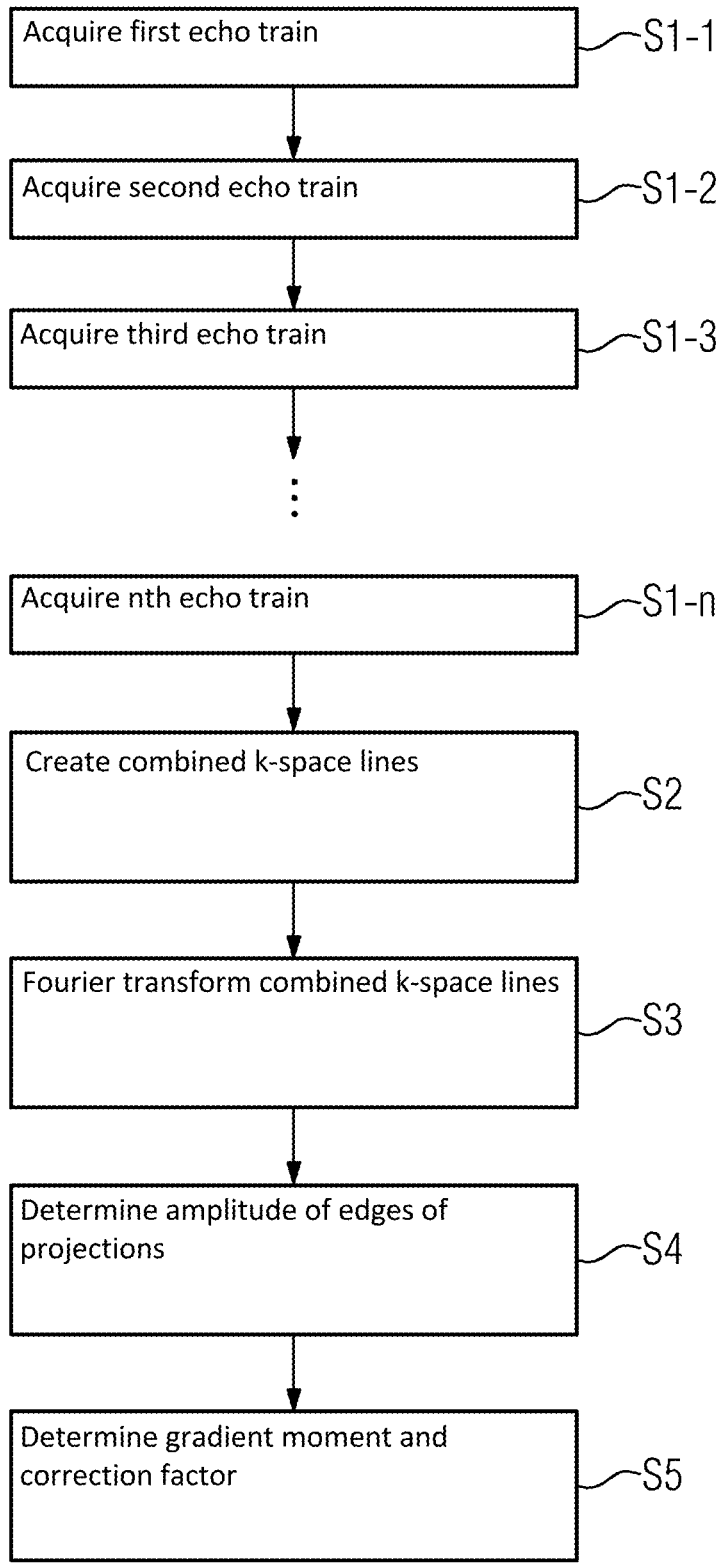

METHOD FOR OBTAINING AN OPERATING PARAMETER, STORAGE MEDIUM, AND MAGNETIC RESONANCE APPARATUS

The present patent document claims the benefit of European Patent Application No. 19151327.4, filed Jan. 11, 2019, which is hereby incorporated by reference.

TECHNICAL FIELD

The present disclosure relates to a method for obtaining an operating parameter of a magnetic resonance apparatus.

BACKGROUND

It is known to execute measurements to gather information on parameters to be optimized for a magnetic resonance (MR) examination before the diagnostic measurements are carried out. These measurements are called adjustment measurements. For example, preliminary scans are used to determine the current resonance frequency. Also, an adjustment of homogenizing currents, called shimming, may be performed.

After the adjustment of general parameters, some parameters of a special scan sequence to be used may be optimized, too.

A known scan sequence is the so-called RESOLVE sequence, (see Porter and Heidemann, High Resolution Diffusion-Weighted Imaging Using Readout-Segmented Echo-Planar Imaging, Parallel Imaging and a Two-Dimensional Navigator-Based Reacquisition, MRM, 62:468-475, 2009). The RESOLVE sequence is a sort of segmented echo planar imaging (EPI) sequence. Here the segmentation is in readout direction in contrast to conventional multi-shot EPI sequences. Additionally, there is a diffusion preparation and a usage of navigator echoes.

Before the signal acquisition using a sinusoidal readout gradient, a dephasing gradient is applied. Regarding the RESOLVE sequence, the gradient moment of the sinusoidal readout gradient is a crucial parameter concerning image quality.

A mismatch between the dephasing gradient moment and the sinusoidal readout gradient moment leads to ringing artifacts in acquired images using the RESOLVE sequence.

Therefore, it is known to adjust the sinusoidal gradient moment. A correction factor may be multiplied either to the dephasing gradient moment or the sinusoidal readout moment, e.g., to the duration or the gradient strength.

This correction factor is obtained by varying several parameters, one of them being the correction factor itself. Further parameters to be respected are the magnetic resonance apparatus type, the echo spacing, and the gradient orientation. Different magnetic resonance apparatus types have different gradient systems and RF coils inside, which affect the signal acquisition.

These parameters are specifically varied and for every set of parameters an image is acquired. The images may contain 128×128 or more data points. Hence, a large number of images has to be gathered, which are then compared with the naked eye or automatically by generating values characterizing the image quality. The image having the least artifacts determines the best correction factor. For every combination of parameters including echo spacing, gradient orientation, and all further relevant parameters, the best matching correction factor has to be found. The correction factor may be between 0.995 and 1.025.

Therefore, the adjustment of the correction factor is very time consuming and therefore is performed only once when the first magnetic resonance apparatus of a specific series is installed.

Unfortunately, ringing artifacts may occur on occasion and without it being possible to assess one specific parameter causing the artifact and therefore to be respected while adjusting the correction factor.

This problem may occur when a gradient, in particular a sinusoidal gradient, is used.

SUMMARY AND DESCRIPTION

The scope of the present disclosure is defined solely by the appended claims and is not affected to any degree by the statements within this summary. The present embodiments may obviate one or more of the drawbacks or limitations in the related art.

There is a need for an adjustment of an operating parameter, e.g., the correction factor or the applied gradient moment of the readout gradient, which is less time consuming and hence may be applied directly previous to a patient examination.

These needs are satisfied in a method for obtaining an operating parameter of a magnetic resonance apparatus. The method includes generating at least one echo train, wherein the generation of an echo train includes: setting a given set of parameters; applying at least one radio frequency excitation pulse; applying a dephasing gradient in readout direction; and reading out the echo train, the echo train including at least two echo signals, wherein a readout gradient is applied while reading out the echo signals. The method also includes acquiring at least two echo signals, wherein the set of parameters differs in at least one parameter being used for different echo signals; processing the echo signals line by line to projections; and obtaining the operating parameter using the projections.

The obtained operating parameter may be used for operating the magnetic resonance apparatus to acquire measurement signals of an object, e.g., a patient. An image may be reconstructed using the acquired measurement signals, e.g., by a reconstruction unit including a processor. The reconstructed image may be displayed, e.g., on a screen.

The main aspect is not to use images but spectra or projections to obtain the searched operating parameter. The echo signals are Fourier transformed only in one dimension. This leads to a spectrum or projection for every Fourier transformed echo signal.

The second advantage is given by a reduced number of parameter sets to be considered. The echo spacing and gradient orientation may be determined before the adjustment measurement and need not to be varied during the measurements.

This results in very short measurement and processing times which allow a determination of the operating parameter just before the RESOLVE measurement and while the patient is already positioned inside the magnetic resonance apparatus.

With regard to the signal acquisition of the adjustment method, some features are explained in further detail herein.

A set of parameters may be a set of values to be used while executing a scan. This may include the duration of an RF pulse, a delay, the RF frequency, the echo time, the repetition time, etc.

An excitation pulse is used to excite the magnetization. Its flip angle may be between 0° and 90°. With regard to spin echo sequences and gradient echo sequences, the flip angle is exactly 90°. Fast gradient echo sequences may have smaller flip angles. The excitation pulse also is used to define the length of the repetition time TR, which is the length of one excitation cycle. Every scan sequence has at least one excitation pulse otherwise there was no signal.

Sometime after the excitation pulse, a dephasing gradient in readout direction is applied. This is a well-known gradient to prepare a gradient echo signal, which is formed together with the so-called readout gradient.

The readout gradient may have a particular shape being of a sinusoidal form. Using this form, the k-space may be segmented in readout direction.

At least one echo train is acquired. The at least two echo signals may be achieved having at least two echoes in one echo train or by acquiring at least two echo trains with one echo signal. Hence, altogether at least two echo signals are measured.

The line by line processing has already been explained above.

This method may be used every time when a badly chosen parameter lowers the quality of the 1D-FT signal, which is the above-mentioned projection. Therefore, the proposed method is described with regard to RESOLVE imaging but may be used for every sequence.

At least two echo trains may be acquired. Advantageously, only one parameter differs in the acquisition of the two or more echo trains. This may be the gradient moment of the dephasing gradient. The dephasing gradient positions the readout position in readout direction. Changing the dephasing gradient at least two segments of the segmented k-space are respected.

Advantageously the gradient moments, in particular their extreme values, of the sinusoidal gradient have constant values. The extreme values are the maxima and minima. To find the right balance between the gradient moment of the dephasing gradient and the sinusoidal readout, gradient measurements have to be executed where the gradient moment of the dephasing gradient and the sinusoidal readout gradient are changed, both being parameters of the set of parameters.

Alternatively, the method may include the gradient moments, in particular the extreme values, of the sinusoidal readout gradient having varying values. The variation of the gradient moments or extreme values may be used to change the gradient moment of the sinusoidal readout gradient within the echo train. Then the adjustment may be further accelerated.

In the following, the method is described with regard to the extreme values of the sinusoidal form. Changing the extreme values changes the gradient moments at the same time.

In a first embodiment, the gradient moments of the arcs or the extreme values may be increasing, in particular linearly increasing. In a second embodiment, the gradient moments of the arcs of the sinusoidal gradient or the extreme values may be decreasing, in particular linearly decreasing.

Respective echo signals of at least two echo trains may be combined to a combined echo signal before the line by line processing. Advantageously, signal echoes acquired with the same gradient moment are connected. With other words, the gradient moments have been multiplied with the same correction factor.

Advantageously, the echo signals of the echo trains are acquired without phase encoding. There shall be no resulting phase in phase encoding direction to acquire only the central k line of the k space. If there are gradients in phase direction like diffusion encoding gradients their net phase has to be zero.

Alternatively, the echo signals of the echo trains may be acquired using less than 15 different phase encoding gradients. In some cases, it may be necessary also to change the phase encoding gradient being one parameter of the set of parameters. This may happen if there is an effect of a strong positive or negative phase encoding gradient on the gradient moment of the dephasing gradient or the sinusoidal readout gradient, respectively. These phase encoding gradients are not used to process an image afterwards but only to see if there is a dependency of the balance between the gradient moment of the dephasing gradient and the sinusoidal readout gradient arising from the phase encoding gradient. The echo signals still are processed line by line.

An echo signal may cover only a part of the k-space in readout direction. As mentioned above, this is a way to segment a sequence in readout direction. Several echo signals combined then cover a single k-space line.

Advantageously every echo train has a plurality of echo signals. There may be up to dozens of echo signals in an echo train. For example, there may be between 40 and 50 echo signals.

The changed parameter of the set of parameters may be one of a group, the group only having the elements dephasing gradient, gradient moment of the sinusoidal gradient, and phase encoding gradient. Using a correction factor for the gradient moment is equivalent to a direct change.

Moreover, all echo trains may have the same number of echo signals. Then all echo signals have respective echo signals in the further echo trains and may be combined to a combined k-space line.

A plurality of correction factors for the sinusoidal gradient moment may be one of the modified parameters of the set of parameters. The correction factors may be changed between the acquisitions of two echo trains. Advantageously, the correction factor is changed for every arc of the sinusoidal readout gradient. Then, a plurality of correction factors is applied in a single echo train.

Advantageously, at least one navigator echo signal is acquired after the acquisition of an echo train. As described above, the proposed method allows adjusting the gradient moment of the dephasing gradient or the sinusoidal readout gradient just previous to a RESOLVE sequence. A patient being positioned in the scanner of a magnetic resonance apparatus may move during the adjustment measurements which lasts only several seconds. Then the results may be further improved by eliminating the movement artifacts. Moreover, the readout gradient of the navigator echoes also may have a sinusoidal form. The gradient moments of the sinusoidal readout gradient of the navigator echoes also may be multiplied with correction factors. Furthermore, the gradient moments may be increasing or decreasing.

After having processed the echo signals or combined echo signals to projections, the projection having the least artifacts may be found automatically. To do so, it may be foreseen to count the number of edges found in every projection and to choose the projection having the lowest number of edges. To avoid biases, the number of edges may be interpolated to find a minimal number of edges. This determines the correction factor or gradient moment.

Alternatively, the correction factor or gradient moment producing the least artifacts may be found using derivations of the element values of the projections. Higher derivations indicate higher artifacts.

Furthermore, the correction factor or gradient moment producing the least artifacts may be found using Fourier coefficients of projections.

Furthermore, the correction factor or gradient moment producing the least artifacts may be found using a similarity analysis. There the combined k-space lines may be compared to artifact free projections.

Alternatively, the correction factor or gradient moment producing the least artifacts may be found using machine learning. A trained machine finds the best projection and the best correction factor automatically.

In accordance with another aspect, a magnetic resonance apparatus is disclosed. The apparatus includes: an MR data acquisition scanner including a radio-frequency transmitter and an RF receiver and a gradient coil arrangement; a memory in which parameter sets are stored; and a computer having access to the memory and being configured to read the parameter sets from the memory, wherein the computer is configured to carry out the method described above.

Each of the embodiments described with regard to the method also may be realized in the magnetic resonance apparatus.

In accordance with another aspect, a non-transitory computer-readable data storage medium encoded with programming instructions is disclosed, the storage medium being loaded into a computer system of a magnetic resonance (MR) apparatus that includes an MR data acquisition scanner having a radio-frequency (RF) transmitter, an RF receiver, a gradient coil arrangement, and a memory, the programming instructions causing the computer system to carry out the method described above.

Each of the embodiments described with regard to the method also may be realized in the data storage medium.

BRIEF DESCRIPTION OF THE DRAWINGS

Further details of the disclosure are provided with reference to the figures.

Parts that correspond to one another are labeled with the same reference characters in all figures.

FIG. 4 depicts an example of a sequence diagram of a measurement sequence.

FIG. 5 depicts an example of a k-space acquisition scheme of the sequence of FIG. 4.

FIG. 6 depicts an example of a first combined k-space line and projection.

FIG. 7 depicts an example of a second combined k-space line and projection.

FIG. 8 depicts an example of a flowchart of a method of adjusting an operating parameter.

DETAILED DESCRIPTION

Figure 1:
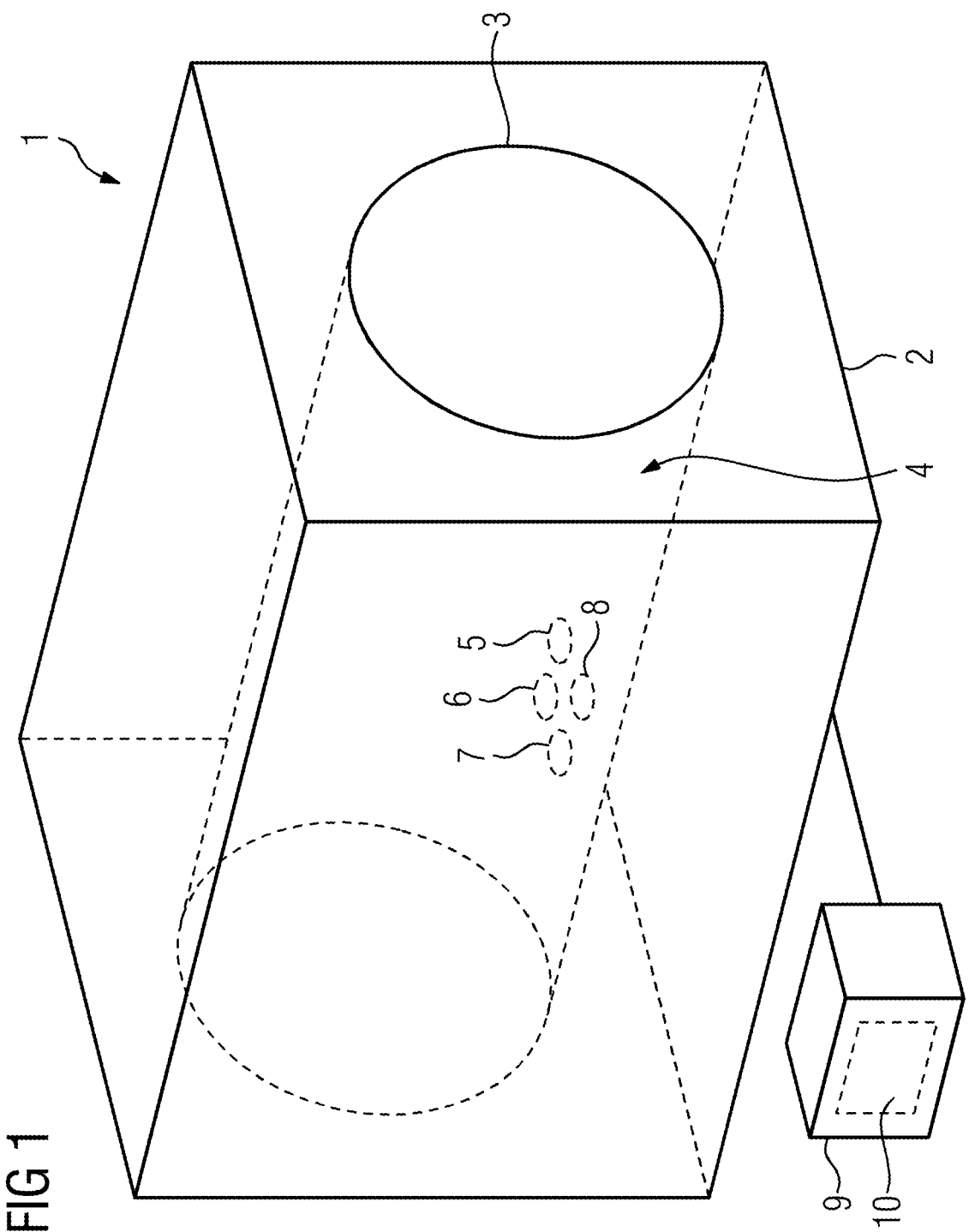
FIG. 1 depicts an embodiment of a magnetic resonance apparatus.

FIG. 1 depicts a magnetic resonance apparatus 1. The magnetic resonance apparatus 1 has a scanner 2. A transmit coil arrangement 3 is part of the scanner 2. The transmit coil arrangement 3 may be configured as a body coil, and thus includes a single coil.

Furthermore, the magnetic resonance apparatus 1 has a reception coil arrangement 4. The reception coil arrangement 4 is a coil array with coils 5, 6, 7, and 8. To enable the coils 5, 6, 7, and 8 to be distinguished more easily, the transmit coil arrangement 3 is shown by a dashed outline.

A control computer 9 controls the operation of the magnetic resonance apparatus 1.

The magnetic resonance apparatus 1 also has a non-transitory data storage medium 10 as part of the control computer 9 or independent thereof, on which computer code for carrying out magnetic resonance measurements is stored.

The coil array 4 is used only to read out the measurement signal which may be an echo signal. The coils 5, 6, 7, and 8 of the coil array 4 read out the measurement signal at the same time. Instead of the coil array 4, an individual coil may also be used as the detection coil for individual embodiments.

Further components of the magnetic resonance apparatus 1, such as gradient coils and a patient bed, are not shown for clarity.

Figure 2:
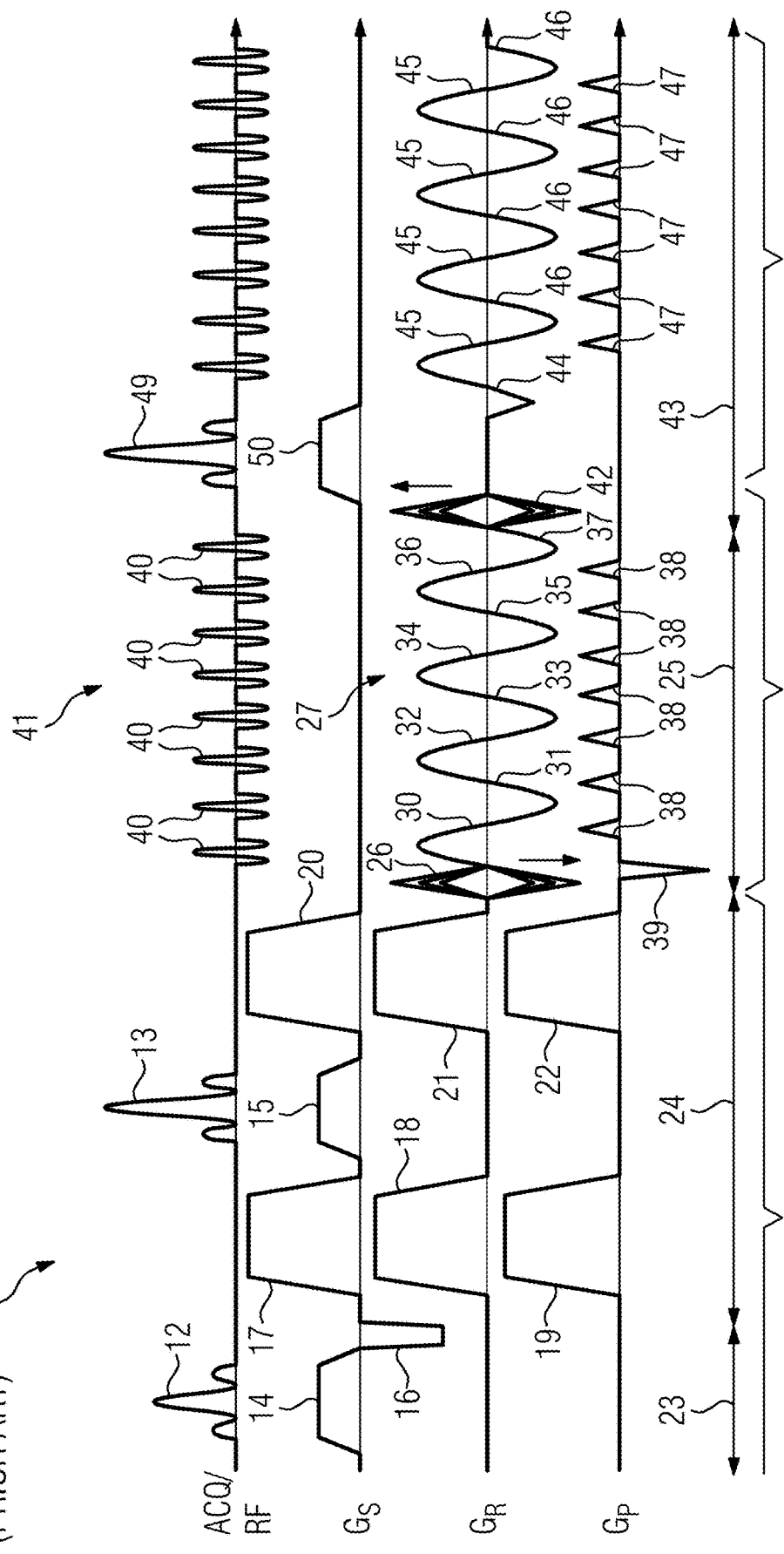
FIG. 2 depicts a prior art sequence diagram of a RESOLVE sequence.

FIG. 2 depicts a sequence diagram 11 of a RESOLVE sequence which is known, for example, from Porter and Heidemann, High Resolution Diffusion-Weighted Imaging Using Readout-Segmented Echo-Planar Imaging, Parallel Imaging and a Two-Dimensional Navigator-Based Reacquisition, MRM, 62:468-475, 2009.

A diffusion preparation section includes an excitation pulse 12 and a refocusing pulse 13. Slice selection gradients 14 and 15 are applied at the same time to select a defined slice in a patient. It is known to use an additional slice rephrasing gradient 16 to compensate the dephasing fraction of the slice selection gradient 14. The diffusion encoding gradients 17, 18 and 19 before the refocusing pulse 13 and the respective gradients 20, 21 and 22 are also basically known.

The excitation pulse 12 and the gradients 14 and 16 are part of an excitation phase 23 of the RESOLVE sequence. The following evolution phase 24 lasts to the end of the diffusion gradients 20, 21 and 22.

After that the readout phase 25 starts. A dephasing gradient 26 having different gradient moments by varying its strength puts the beginning of the readout in the readout direction to a desired position in k-space. This is shown in the following figure.

A sinusoidal readout gradient 27 has a plurality of arcs 30, 31, 32, 33, 34, 35, 36, and 37. Every arc 30, 31, 32, 33, 34, 35, 36, and 37 encodes one partial line in a readout direction in the k-space.

The phase encoding gradients 38 shift the encoding for one step in phase encoding direction. Therefore, the phase encoding gradients 38 are called blips or gradient blips.

An initial phase encoding gradient 39 puts, similar to the dephasing gradient 26, the beginning of the readout in the phase encoding direction to a desired position in k-space.

In the readout phase 25, all echo signals 40 of one so called segment may be acquired. All signal echoes of an excitation cycle generate an echo train 41. At the end of the readout phase the encoding is put back to the starting point by applying a gradient 42 which has the same gradient moment as the dephasing gradient 26 but the opposite sign.

After the readout phase 25 a navigator phase 43 follows. The respective gradients 44, 45, 46, and 47 operate as described with regard to the readout phase 25. The echo signals 48 are generated using a refocusing pulse 49 and a slice selection gradient 50.

Figure 3:
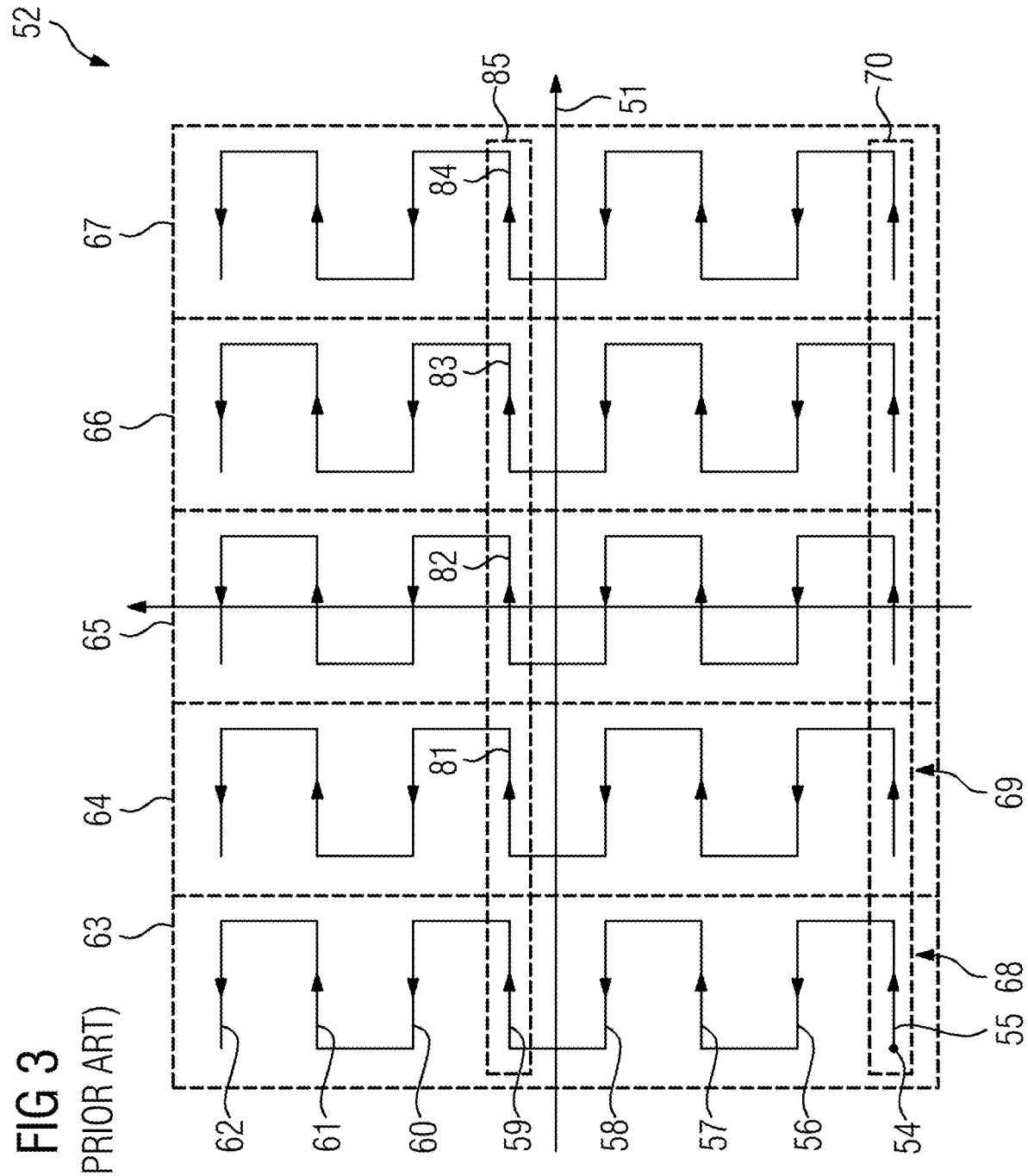
FIG. 3 depicts a prior art k-space acquisition scheme of a RESOLVE sequence.

FIG. 3 depicts a k-space acquisition scheme used by the sequence 11. An axis 51 denotes the k(x) direction of the k-space 52 and an axis 53 the k(y) direction. The k(x) direction is also called readout direction and the k(y) direction phase encoding direction.

After the preparation of the signal for example by diffusion weighting the gradients 26 and 39 put the encoding to the first starting point 54. The partial line 55 is acquired while the arc 30 is applied, the partial line 56 at the same time as the arc 31 applied. The shift in phase encoding direction is achieved by one of the blips 38.

The additional partial lines 57, 58, 59, 60, 61, and 62 are created in the same way. The partial lines 55 to 62 or echo signals 40 constitute an echo train 41.

The partial lines 55 to 62 cover a segment 63 of the k-space 52 which is separated in k(x) direction.

Applying the sequence 11 by using a dephasing gradient 26 having a different gradient moment allows the acquisition of the echo signals of one the segments 64, 65, 66, or 67 of the k-space 52.

If an echo train 41 has all echo signals of a segment 63 to 67 of the k-space 52, a number of excitation cycles is needed that is the number of segments the k-space 52 has.

If an echo train 41 has only a fraction of the echo signals of a k-space segment, the excitation cycle has to be repeated more often. Then, the k-space 52 was divided in readout direction and phase encoding direction.

The trajectories 68 and 69 of two adjacent segments, e.g., the parts 63 and 64, have a gap for the sake of clarity. In reality, the echo signals of a k-space line cover the k-space 52 totally without gaps.

Images are reconstructed using the echo signals of all excitation cycles having the same position in phase encoding direction as one k-space line.

FIG. 4 depicts a sequence diagram 71 of an adjustment sequence. Parts that correspond to FIG. 2 are labeled with the same reference characters.

Diffusion gradients 17, 18, 19, 20, 21, and 22 as well as phase encoding gradients 38 are not applied. Then, the central k lines in phase encoding direction are acquired.

To fasten the adjustment measurement, the arcs or gradient moments 30 to 37 of FIG. 2 are multiplied with a correction factor $a_+$, $a_-$, $b_+$, $b_-$, $c_+$, $c_-$, $d_+$, and $d_-$, respectively. That means that the gradient moment of arc 30 is multiplied with the correction factor $a_+$, the gradient moment of arc 31 with the correction factor $a_-$, and so on. Every gradient moment of an arc is multiplied with one of the correction factors. If the positive extreme value was set to 1, the correction factor may set a range from 1.03 to 0.99. Hence $a_+$ may be 1.05, $a_-$ 1.04, $b_+$ 1.03, $b_-$ 1.02, $c_+$ 1.01, $c_-$ 1.00, $d_+$ 0.99 and $d_-$ 0.98. Of course, there may be more echoes in an echo train and a respective number of correction factors. There may be more than forty echo signals 40 in an echo train 41 and a respective number of correction factors. The range may be from 0.98 to 1.04 and independent of the number of echo signals. The arcs or gradient moments have new character signs 72, 73, 74, 75, 76, 77, 78 and 79 to show the difference to FIG. 2. The gradient moments 72 to 79 show a larger decrease than that the correction factors cause in reality to make the decrease visible.

The arcs or gradient moments 72, 73, 74, 75, 76, 77, 78, and 79 show a larger decrease than that the correction factors cause in reality to make the decrease visible.

One of the partial lines, e.g., the partial line 55, is acquired n times, n being the number of echoes of the echo train 41, by executing one excitation cycle.

Instead of decreasing gradient moments increasing gradient moments may be used as well for the arcs of the sinusoidal readout gradient.

The increase or decrease of the correction factors is advantageously linear, as shown by the numbers above.

At least two of the segments 63 to 67 may be acquired, but only one partial line of them, respectively. Instead of a phase encoding a correction factor variation is applied between different echo signals 40.

In one excitation cycle, one echo train 41 is acquired. The position of its echo signals 40 are shown in FIG. 5. There are eight echo signals, which originally are at the same position in k-space 52. Only the orientation may differ. They are shifted in phase encoding direction to make them all visible.

Then all acquired partial lines 59, 81, 82, 83, and 84 being acquired using the same correction factor are combined to a combined k-space line 85. This is shown in FIG. 6. If eight correction factors are used, eight combined k-space lines 85 are achieved. The more correction factors are applied the more combined k-space lines are received.

These combined k-space lines 85 are processed line by line. They may be Fourier transformed in one dimension. A zerofilling may be performed. Keeping the example of eight combined k-space lines one gets eight projections.

The optimal correction factor may be found by an automatic examination of the projections. For example, an edge detection algorithm may be executed. The least number/amplitude of edges shows the best correction factor.

To avoid bias an interpolation may be used.

If the sequence 71 of FIG. 4 is executed several times, several combined k-space lines are acquired.

Let assume a number of five repetitions. The first repetition is executed using a first gradient moment of the dephasing gradient 26 as a first operating parameter. The correction factors $a_+$, $a_-$, $b_+$, $b_-$, $c_+$, $c_-$, $d_+$, and $d_-$ are applied changing the gradient moment of the readout gradient being a second operating parameter being changed.

In the second repetition, a second gradient moment of the dephasing gradient 26 as the first changed operating parameter is used. Then eight echo signals 40 of a second segment are acquired.

This is repeated with a third, fourth, and fifth gradient moment of the dephasing gradient 26. Using them echo signals in the segments 65, 66 and 67 are measured.

These echo signals are combined as follows.

The first echo signals 40 of every excitation cycle, which have been measured using the correction factor $a_+$, are combined to a combined k-space line 86. This is shown in FIG. 6. Partial line 87 comes from the first repetition, partial line 88 from the second repetition, and so on.

A second combined k-space line 92 is shown in FIG. 7. There the second echoes of the five repetitions acquired using the correction factor $a_-$ are combined.

The partial lines 93, 94, 95, 96, and 97 form the combined k-space line 92. They are measured as described.

This combination may be performed for every echo signal 40 in an echo train 41.

Every combined k-space line is then Fourier transformed to a projection 98 and 99, respectively.

A combination of projections 87, 88, 89, 90, 91 into a combined k-space line 86 may involve a gridding operation, e.g., an accounting for the non-linear k-space acquisition during the sinusoidal gradient lobes.

Afterwards, all projections 98 and 99 are examined with an algorithm, for example, an edge detection. The number of detected edges may be plotted against the correction factor. The correction factor stands for a gradient moment. Using the number of edges, a minimal number may be found using a regression analysis or a different known way of analysis.

The procedure to achieve an optimal correction factor is shown in the flow chart of FIG. 8, where all described acts are combined.

In act S1-1, a first echo train 41 is acquired using the sequence 71 and having set a first dephasing gradient 26. The echo train 41 has e.g. eight echo signals which are acquired using the correction factors $a_+$, $a_-$, $b_+$, $b_-$, $c_+$, $c_-$, $d_+$, and $d_-$. All echo signals are located at the same position in k-space phase encoding direction and are in a first of the segments 62 to 67. That says that the gradient moment of the sinusoidal readout gradient being an operating parameter is changed within the excitation cycle.

In act S1-2, a second echo train 41 is acquired using the sequence 71 and having set a second dephasing gradient 26. The echo train 41 again has eight echo signals. All echo signals are located at the same position in k-space and are in a second of the segments 62 to 67.

Accordingly, acts S1-3 to S1-$n$ are performed using further gradient moments for the dephasing gradient 26 to cover some or all of the further segments 62 to 67. In the case of five segments, acts S1-1 to S1-5 would be performed to cover all segments.

The gradient moment of the dephasing gradient is a second operating parameter which is changed between two excitation cycles. This change is not with regard to an optimization but due to the segmentation of the k-space.

In act S2, combined k-space lines 85, 86, and 92 are created by combining all first echo signals of the acquired echo trains to a first combined k-space line, all the second echo signals to a second combined k-space line, and so on. This presumes that the first echo signals are acquired with the correction factor $a_+$, the second ones with the correction factor $a_-$. The main thing combining the echo signals is not the position of the echo but the correction factor.

In act S3, the combined k-space lines 85, 86 and 92 are Fourier transformed in one dimension to projections 98 and 99.

In act S4, an edge detection algorithm determines the amplitude of the edges of every projection 98 and 99.

In act S5, the gradient moment and correction factor, respectively, creating the least amplitude of the amplitudes of the edges is determined.

This method may be performed just before a RESOLVE measurement taking only about a few seconds. Then the images have less artifacts.

Although the disclosure has been illustrated and described in detail using the exemplary embodiments, the disclosure is not limited by the disclosed examples, and a person skilled in the art may derive other variations therefrom without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for obtaining an operating parameter of a magnetic resonance apparatus, the method comprising:
   generating at least one echo train, wherein the generation comprises:
      setting a given set of parameters;
      applying at least one radio frequency excitation pulse;
      applying a dephasing gradient in a readout direction;
      reading out the at least one echo train, each echo train of the at least one echo train comprising echo signals; and
      applying a readout gradient while reading out the echo signals, wherein the readout gradient has a sinusoidal form having at least one arc,
   acquiring at least two echo signals, wherein the set of parameters differs in at least one parameter being used for different echo signals;
   processing the echo signals line by line to projections; and
   obtaining the operating parameter using the projections, wherein the operating parameter is a correction factor of a gradient moment of the readout gradient.

2. A magnetic resonance apparatus comprising:
   a magnetic resonance (MR) data acquisition scanner comprising a radio-frequency transmitter, a radio-frequency (RF) receiver, and a gradient coil arrangement;
   a memory in which parameter sets are configured to be stored; and
   a computer having access to the memory and configured to read the parameter sets from the memory,
   wherein the computer is configured to:
      generate at least one echo train, which comprises: setting a given set of parameters; applying at least one radio frequency excitation pulse; applying a dephasing gradient in a readout direction; reading out the at least one echo train, each echo train of the at least one echo train comprising echo signals; and applying a readout gradient while reading out the echo signals, wherein the readout gradient has a sinusoidal form having at least one arc;
      acquire at least two echo signals, wherein the set of parameters differs in at least one parameter being used for different echo signals;
      process the echo signals line by line to projections; and
      obtain an operating parameter using the projections, wherein the operating parameter is a correction factor of a gradient moment of the readout gradient.

3. A method for obtaining an optimal correction factor of a magnetic resonance apparatus, the method comprising:
   acquiring a plurality of echo trains in a plurality of different segments of k-space in a readout direction, each echo train of the plurality of echo trains having applied a respective dephasing gradient, wherein each echo train of the plurality of echo trains comprises a plurality of echo signals acquired using a plurality of correction factors;
   combining echo signals from each echo train of the plurality of echo trains acquired with a same correction factor to provide a plurality of combined k-space lines;
   processing the combined echo signals into one-dimensional projections via Fourier transformation;
   determining amplitudes of edges of each one-dimensional projection of the one-dimensional projections; and
   determining a correction factor that creates a least amplitude of the determined amplitudes of edges.

4. The method of claim 1, wherein gradient moments or extreme values of the readout gradient have varying values.

5. The method of claim 1, wherein gradient moments or extreme values of the readout gradient have increasing values.

6. The method of claim 1, wherein gradient moments or extreme values of the readout gradient have decreasing values.

7. The method of claim 1, wherein the echo signals acquired with a same gradient moment are combined to a combined k-space line.

8. The method of claim 1, wherein the echo signals of the at least one echo train are acquired without phase encoding.

9. The method of claim 1, wherein the echo signals cover only a segment of a k-space in the readout direction.

10. The method of claim 1, wherein the at least one echo train comprises a plurality of echo trains, and
    wherein each echo train of the plurality of echo trains has a plurality of echo signals.

11. The method of claim 1, wherein the at least one echo train comprises a plurality of echo trains, and
    wherein every echo train of the plurality of echo trains has a same number of echo signals.

12. The method of claim 1, comprising a plurality of correction factors for multiplication with the readout gradient, the plurality of correction factors being a modified parameter of the set of parameters.

13. The method of claim 1, wherein a gradient moment of the dephasing gradient is a modified parameter of the set of parameters.

\* \* \* \* \*